Dec. 15, 1964 G. R. BROUSSARD 3,161,810

TEMPERATURE COMPENSATED TRANSISTOR

Filed Dec. 11, 1959 2 Sheets-Sheet 1

INVENTOR.
Gerald R. Broussard
BY Stevens, Davis, Miller & Mosher
ATTORNEYS

INVENTOR
Gerald R. Broussard

BY Stevens, Davis, Miller & Mosher
ATTORNEYS

United States Patent Office 3,161,810

Patented Dec. 15, 1964

3,161,810

TEMPERATURE COMPENSATED TRANSISTOR

Gerald R. Broussard, Richardson, Tex., assignor to Texas Instruments Incorporated, Dallas, Tex., a corporation of Delaware Filed Dec. 11, 1959, Ser. No. 858,874
2 Claims. (Cl. 317—234)

This invention relates to transducers, and more particularly to transducing devices which utilize semiconductor phenomena for converting physical displacements into varying electric currents.

The present invention makes general use of the discovery that the current gain, or Beta, of a grown junction transistor experiences a change as a result of the application of a mechanical stress. The invention makes particular use of the manner in which the application of tensile, compressive, or torsion forces causes a discernible change in the value of current gain of a plural layer semiconductor amplifying device.

In the experimental work leading to the development of the embodiments of the present invention, it has been discovered that the current gain of a grown junction transistor changes in substantially direct proportion to the amount of pressure which is applied to the ends of the transistor bar. For instance, when such a grown junction transistor bar is positioned in a device in which a variable pressure may be applied to the opposite ends of the bar, the current gain of the transistor may be caused to vary in a manner which is linearly related to the compressive stress set up in the transistor.

In experimenting on a commercially available transistor such as the TI–970 type unit produced by Texas Instruments Incorporated, of Dallas, Texas, the current gain may be shown to experience an appreciable reduction when compressive force is applied to the ends of the transistor bar. When the sides of the transistor are subjected to the same type of compressive stress, the current gain may also be seen to decrease sharply. Other forms of stresses such as bending and torsion will also decrease substantially the current gain. In both n-p-n and p-n-p transistors, the inter-relationship between the current gain and the pressure applied to the ends of the transistor bars is equally evident. With an n-p-n type transistor, the current gain can be caused to diminish in accordance with applied pressure, while the gain of a p-n-p unit increases when a compressive stress is applied to the ends of the transistor bar. Further, tensile stress load will exhibit the opposite effect from that above by causing current gain to decrease in p-n-p devices and to increase in n-p-n devices.

The present invention exploits these relationships between the current gain of a transistor and the amount of applied mechanical stress in several embodiments. In one embodiment of the present invention, the physical deflections of a phonograph needle act on one end of a transistor element in order to modulate the flow of electric current therethrough by varying the current gain.

In another embodiment according to the broad inventive concept, the load current of a generator is used to energize a solenoid which exerts a variable force in relation to varying load current on a plural layer transistor element. The transistor element thus employed is used to regulate the value of current in the field circuit which provides the magnetic flux for the generator.

In still another embodiment of the invention, thermally responsive spring means are used to compress a transistor in a manner which compensates for the undesired change in gain normally occasioned by temperature changes.

In another embodiment of the invention, a screw is mounted for stressing the transistor element to provide a transistor having a variable current gain.

Accordingly, therefore, a primary object of the present invention is to provide transducer devices which employ a grown junction semiconductor amplifying device for converting mechanical variations into electrical signals.

Another object of the present invention is to provide semiconductor transducer assemblies in which the interrelationship between current gain and applied mechanical stress is exploited.

A further object of this invention is to provide method and means for exploiting the change in current gain which occurs in a transistor because of the application of mechanical stress thereto.

These and other objects of the invention will become apparent by referring to the accompanying detailed description and drawing, in which like numerals indicate like parts, and in which.

Figures 1, 2, 3:
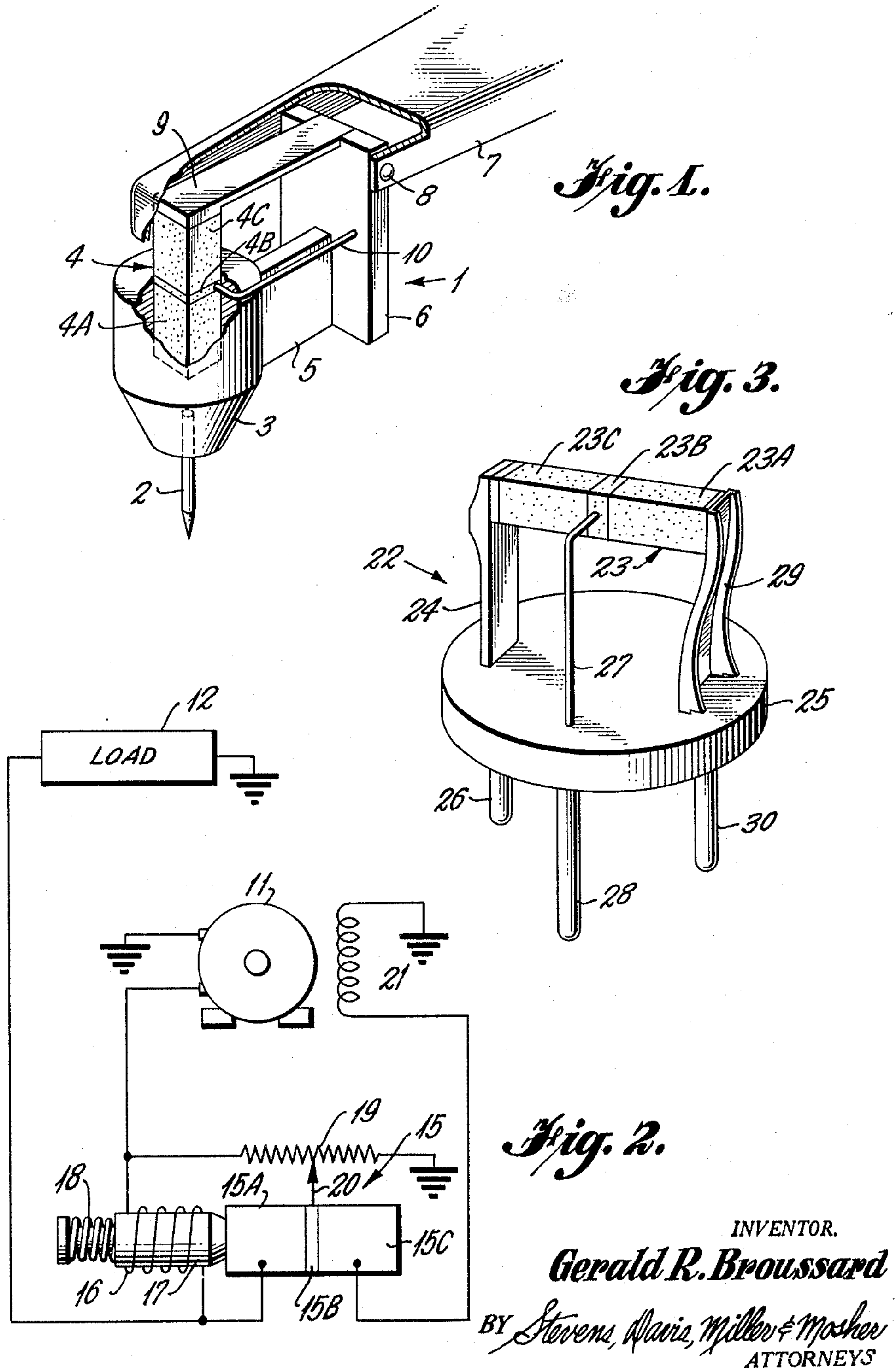
FIGURE 1 illustrates the application of the inventive concept in a phonograph pickup in which mechanical movements of the phonograph needle are converted into varying electrical signals by effecting a variable stress in a plural layer transistor element.
FIGURE 2 illustrates an application of the inventive concept in regulating the output voltage of a generator. In this embodiment, mechanical force is developed by a solenoid which samples load current and exerts a variable compressive stress on a plural layer transistor element, which regulates field excitation.
FIGURE 3 illustrates the application of the inventive concept in temperature compensating a plural layer transistor by using a temperature-sensitive spring tab which stabilizes the current gain during changes in temperature.

As shown in FIGURE 1, the numeral 1 has been used to indicate generally the structure and components of a phonograph pickup unit constructed according to the teaching of the present invention. In this unit, a phonograph needle 2 is employed for engaging the irregularities in a conventional grooved record. The needle 2 is firmly secured to a metallic plug 3 for the purpose of transferring physical deflections thereto.

Above the phonograph needle 2 there is positioned a plural layer grown junction transistor element which is indicated generally by the reference numeral 4. The transistor element 4 is of conventional construction, and includes emitter, base and collector zones 4A, 4B and 4C respectively.

The emitter zone 4A is rigidly mounted within an appropriately sized recess in the metallic plug 3. Through the advantageous employment of shaped insulating spacer 5, the plug 3 is disposed for sideways movement only. Thus, the plug is prevented from movement in a direction parallel to the axis of the arm 7 by the presence of spacer 5 itself; and it is restrained from vertical movement by the spacer's relatively high vertical bending moment.

It will be observed from reference to the figure that the width of spacer 5 is small. This is intended to render the spacer relatively flexible in the sideways direction in order that plug 3 may move correspondingly. The header 6 is rigidly secured to a tone arm 7 by means of a screw 8, or like fastening means. It will be appreciated that the tone arm 7 must posses sufficient inertia or resistance to movement to maintain the upper end of the transistor element 4 relatively immobile during the vibratory action of the phonograph needle 2.

In the upper portion of the assembly shown in FIGURE 1, the reference numeral 9 has been used to identify an elongated T-shaped metallic tab which is disposed at one end to form an ohmic junction with the collector zone 4C of the transistor. The tab 9 is mounted in the assembly to provide a rigid beam spacing support between the header 6 and the upper portion of the transistor element 4.

Spacer bar 5 and elongated T-shaped tab 9 move, if at all, concertedly in the vertical plane thereby eliminating any compressive force which might otherwise incidentally be exerted on transistor 4. The rigid vertical relation between spacer bar 5 and elongated T-shaped tab 9 does not prevent phonograph needle 2 and metallic plug 3 from moving in a lateral direction thereby creating bending stress in transistor 4 in accordance with phonograph record sound patterns.

The tab 9 and the flexible bar 5 provide conductive paths to the collector and emitter zones of the transistor element, respectively. Electrical connection to the base zone 4B is provided by means of an electrode 10 which forms an2 ohmic contact with this zone, and extends through the header. The elongated T-shaped tab 9, the electrode 10, and the flexible bar 5 all extend through the header 6 to the rear surface thereof in order to expedite the connection of appropriate electrical connections thereto.

In operation, the vibratory motion of the phonograph needle 2 caused by the sound pattern on a phonograph record causes the metallic plug 3 to exert a laterally varying bending force on the emitter zone 4A of the transistor. The biasing or quiescent current which flows through the transistor during operation is modulated by the change in current gain which results from the application of the varying bending stress. In this manner, the physical deflections of the phonograph needle are converted into varying electrical signals suitable for amplification and development into audible sound energy.

In FIGURE 2, which shows the embodiment for regulating the output of a generator to maintain a substantially constant terminal voltage, the numeral 11 has been used to identify a D.C. generator of conventional design and construction which is connected to supply current to a load 12. The numeral 15 generally designates a plural layer transistor element which includes an emitter zone 15A, a base zone 15B, and a collector zone 15C. To the left of the transistor element 15 there is shown a solenoid coil 16, which is positioned to exert a variable magnetically induced force upon a solenoid core 17. The core is restrained against indiscriminate movement by means of a biasing spring 18. One output terminal of the generator 11 is grounded and the other output terminal of the generator 11 is connected through the solenoid coil to one side of the load 12, the other side of which is grounded. The generator 11 thus supplies current to the load 12 through the solenoid coil 16.

The junction between the solenoid coil 16 and the load 12 is connected to an emitter electrode in ohmic contact with the emitter zone 15A. A collector electrode in ohmic contact with the collector zone 15C is connected to one side of field winding 21 of the generator 11. The other side of the field winding 21 is grounded. A potentiometer 19 is connected from the ungrounded output terminal of the generator 11 to ground. Movable contact 20 of the potentiometer 19 is connected to a base electrode in ohmic contact with the base layer 15B and provides a control for the bias applied to the base electrode.

The load current applied by the generator 11 to the load 12 flows through the solenoid coil 16. The resulting axial force exerted upon the solenoid core 17 produces a changing compressive force on the end of the emitter zone 15A, and modulates the current gain of the transistor accordingly. Some of the output current from the generator 11 flowing through the solenoid coil 16 flows through the transistor element 15 to the field winding 21. Increases in load current, effecting a decrease in terminal voltage, energize the solenoid coil 16 to a higher flux density thereby exerting more pull on the solenoid core 17 which in turn applies more compressive force on the transistor 15. The increasing force on transistor 15 causes an increase in current gain which increases the current flowing in the field winding 21 of generator 11, thereby effectively increasing the generator excitation. The increase in excitation results in a compensatory increase in generated voltage.

In the embodiment shown in FIGURE 3, the numeral 22 is used to indicate generally a temperature-compensated transistor assembly constructed according to the teachings of the present invention. In this assembly, there is shown a transistor element 23 provided with an emitter zone 23A, a base zone 23B, and a collector zone 23C. A metallic tab 24 is connected to form an ohmic junction or contact with the end surface of the collector zone 23C. The tab 24 is mounted to contact and partially penetrate a header 25 in order to provide conductive contact with a prong 26. The base zone 23B forms an ohmic contact with a lead wire 27, and this wire is mounted to penetrate the header 25 and contact a prong 28.

The emitter zone 23A is maintained in spaced relationship with the header 25 by means of a formed spring tab 29. The spring tab 29 is flexed or bent in order to exert a compressive force against the transistor 23. One end of the spring tab 29 forms an ohmic contact with the emitter zone 23A, and the opposite end of the tab is conductively connected through the header 25 to prong 30.

The spring tab 29 is contructed of a temperature-responsive material such as Phosphor bronze or the like in which increased temperatures tend to change the degree of curvature of the tab. Consequently, when the temperature of the transistor changes, a corresponding change is imparted to the tab, and there is a resulting change in the flexure of the formed spring tab which in turn charges the stress on the transistor element 23 to compensatorily affect the transistor current gain.

By properly correlating the value of this stress with the undesired change in current gain which occurs in a transistor with temperature, the current gain is stabilized over a wide range of temperatures. The corrective change in gain which occurs upon application of stress to the transistor bar acts to null-out, or eliminate the undesired changes in gain caused by temperature variations.

Figure 4:
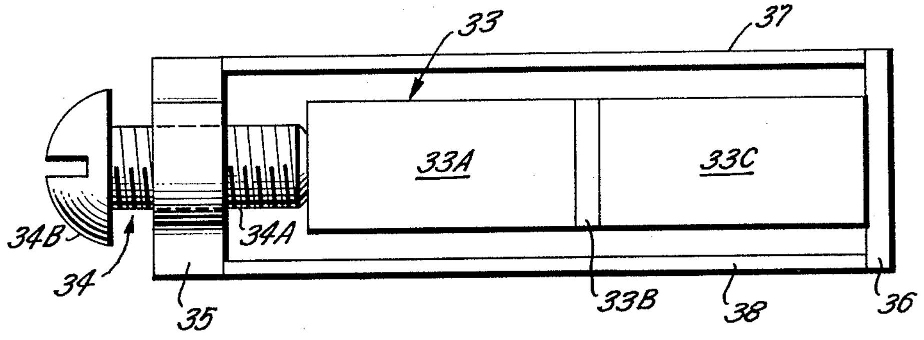
FIGURE 4 illustrates the application of the inventive concept in a transistor having variable current gain as controlled by the compressive stress applied by a screw.

In the embodiment shown in FIGURE 4, the number 33 generally designates a junction transistor element comprising emitter zone 33A, a base zone 33B, and a collector zone 33C. A screw 34 comprising a threaded rod 34A and a head 34B is used to apply a variable compressive stress to the transistor element 33. The rod 34A makes a threaded fit with yoke 35 and abuts against the end of the transistor element 33 comprising the emitter zone 33A. A disc 36, which is fixed to yoke 35 by horizontally extending members 37 and 38, abuts against the other end of the transistor element comprising the emitter zone 33C. The screw 34 puts the base zone 33B in compression between the emitter and collector zones 33A and 33C. Thus, the junctions between the zones are put under compressive stresses, which may be varied by rotating the screw 34 in the yoke 35. In this manner the current gain or Beta of the transistor may be mechanically varied. The head 34B provides a mechanical limit to how far the screw 34 may be advanced through the yoke 35 and thus provides a limit to the amount of stress which may be applied to the transistor element 33.

The above disclosure is of the preferred embodiments of the invention and many modifications may be made thereto without departing from the spirit and scope of the invention, which is limited only as defined in the appended claims.

What is claimed is:

1. A temperature-compensated transistor assembly which includes header means; a plural layer transistor element comprising collector, base, and emitter zones; a rigid tab connected in ohmic contact with one of the end surfaces of said transistor, said tab being mounted to secure said surface in spaced relationship with said header; and a temperature-responsive formed spring tab connected in ohmic contact with the other end surface of said transistor and mounted to maintain said other end surface in spaced relationship with respect to said header, said spring tab being adapted to experience changing degrees of flexure with changing temperatures in order to provide a varying longitudinal compressive stress on said transistor.

2. A temperature-compensated transistor assembly which includes header means; a plural layer transistor element comprising collector, base, and emitter zones; a rigid tab connected in ohmic contact with the end surface of the collector zone of said transistor, said tab being mounted to secure said zone in spaced relationship with said header; a temperature-responsive spring tab connected in ohmic contact with the end surface of said emitter zone and mounted to maintain said zone in spaced relationship with respect to said header, said spring tab being adapted to experience changing degrees of flexure with changing temperatures to provide a varying longitudinal compressive stress on said emitter zone thereby; and means including lead wire means connected to form an ohmic junction with said base zone and penetrate said header to allow electrical access to said base zone.

References Cited in the file of this patent

UNITED STATES PATENTS

| | | |
|---|---|---|
| 2,632,062 | Montgomery | Mar. 17, 1953 |
| 2,645,683 | Anderson | July 14, 1953 |
| 2,716,722 | Rothstein | Aug. 30, 1955 |
| 2,730,572 | Andres | Jan. 10, 1956 |
| 2,734,102 | Pankove | Feb. 7, 1956 |
| 2,929,885 | Mueller | Mar. 22, 1960 |
| 2,935,665 | Coyle | May 3, 1960 |
| 2,945,174 | Hetzler | July 12, 1960 |
| 2,948,835 | Runyan | Aug. 9, 1960 |
| 2,949,575 | Shadle | Aug. 16, 1960 |